(12) United States Patent
Iriguchi et al.

(10) Patent No.: US 8,906,777 B2
(45) Date of Patent: Dec. 9, 2014

(54) METHODS FOR EVALUATING AND MANUFACTURING SEMICONDUCTOR WAFER

(75) Inventors: Kazuhiro Iriguchi, Nagasaki (JP);
Toshiyuki Isami, Kanagawa (JP);
Kouhei Kawano, Kanagawa (JP)

(73) Assignee: Sumco Techxiv Corporation, Nagasaki (JP)

( * ) Notice: Subject to any disclaimer, the term of this patent is extended or adjusted under 35 U.S.C. 154(b) by 189 days.

(21) Appl. No.: 12/361,929

(22) Filed: Jan. 29, 2009

(65) Prior Publication Data
US 2009/0197359 A1    Aug. 6, 2009

(30) Foreign Application Priority Data

Jan. 31, 2008   (JP) ................................. 2008-020258

(51) Int. Cl.
*H01L 23/13*   (2006.01)
*H01L 21/66*   (2006.01)

(52) U.S. Cl.
CPC ...................................... *H01L 22/12* (2013.01)
USPC ............ 438/458; 438/689; 438/16; 73/150 A; 355/72

(58) Field of Classification Search
USPC ......................................................... 438/689
See application file for complete search history.

(56) References Cited

U.S. PATENT DOCUMENTS

| 6,566,267 B1 | 5/2003 | Wenski | |
| 2004/0185662 A1* | 9/2004 | Fujisawa et al. | 438/689 |
| 2006/0004542 A1* | 1/2006 | Koliopoulos et al. | 702/182 |
| 2007/0066082 A1 | 3/2007 | Schauer et al. | |
| 2007/0177126 A1* | 8/2007 | Fujisawa et al. | 355/72 |

FOREIGN PATENT DOCUMENTS

| JP | 2000-031224 | * | 1/2000 |
| JP | 2001/196334 A | | 7/2001 |
| JP | 2004-020286 | | 1/2004 |
| JP | 2007/088473 A | | 4/2007 |
| WO | WO 03/003441 A1 | | 1/2003 |

OTHER PUBLICATIONS

MTI Instruments, Thickness, Shape and Flatness Measurement of Semiconductor Wafers, Application Notes, Retrieved Sep. 3, 2010 from Internet Site http://www.mtiinstruments.com/mtiuniversity/appnotes/mtiuniversity-appnotes-wafer_measurement.aspx, 5 pages total.
Japan Patent Office, Notification of Reasons for Rejection for Application No. 2008-020258, mailed Sep. 25, 2012, 9 pages, Japan.

(Continued)

*Primary Examiner* — Julio J Maldonado
*Assistant Examiner* — Mohammad Choudhry
(74) *Attorney, Agent, or Firm* — Alston & Bird LLP

(57) ABSTRACT

A method for evaluating a shape change of a semiconductor wafer is provided. The method comprises acquiring unconstrained shape data of shape data of the semiconductor wafer being placed on a reference surface in a unconstrained state; acquiring constrained shape data of shape data of the semiconductor wafer being constrained along the reference surface in a constrained state; and comparing the unconstrained shape data and the constrained shape data. A method for manufacturing the semiconductor wafer utilizing a result of the evaluation of the wafer is also provided.

18 Claims, 15 Drawing Sheets

(56) References Cited

OTHER PUBLICATIONS

Sueoka K et al., "*Effect of Oxide Precipitates Sizes on the Mechanical Strength of Czochralski Silicon Wafers*," Japanese Journal of Applied Physics, Japan Society of Applied Physics, JP, vol. 36, No. 12A, Part 01, Dec. 1, 1997, pp. 7095-7099, XP001110829, ISSN: 0021-4922, DOI: DOI:10.1143/JJAP.36.7095.

Extended European Search Report of related European Patent Applicatin No. 07828765.3-1235, dated Apr. 7, 2011.

* cited by examiner

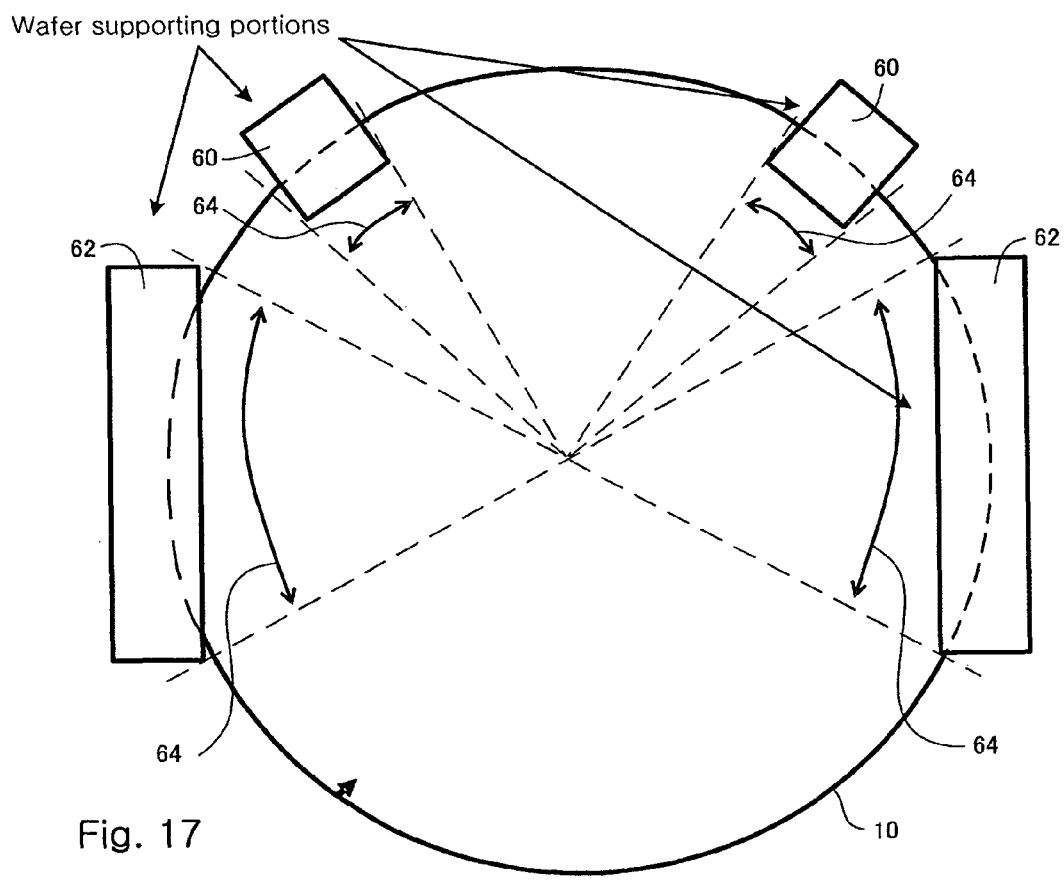

METHODS FOR EVALUATING AND MANUFACTURING SEMICONDUCTOR WAFER

CROSS REFERENCE TO RELATED APPLICATIONS

This application is based upon and claims the benefits of priority from Japanese Patent Application No. 2008-020258 filed on Jan. 31, 2008, the entire contents of which are incorporated herein by reference.

FIELD OF THE INVENTION

The present invention relates to a method for evaluating a semiconductor wafer (hereafter referred to as "wafer") and a method for manufacturing the wafer.

BACKGROUND ART

Recently, with the miniaturization of semiconductor devices, surface shape and other quality requirements of silicon wafers, which are the principal materials of such devices, are becoming more advanced. For example, in order to obtain as many chips as possible from a single wafer, it is desired that a wafer be made high in flatness up to an outer edge thereof. In other words, prevention of a "bulged shape" or a "drooped shape at the outer edge," which may be called ERO (edge roll-off), is an important theme in wafer manufacturing processes and device processes.

Here, as a method for evaluating a shape of a wafer by quantifying the shape, for example, SFQR (site front least squares range) is used. Also as an ERO evaluation method, methods such as ROA (roll-off amount), etc., are used.

As another method for evaluating the shape of a wafer, Japanese Unexamined Laid-Open Patent Application No. 2004-020286 discloses a method for evaluating the shape of a wafer by applying a differentiation process and the like to shape data of the wafer measured as both or either of a front surface and a rear surface of the wafer are scanned. A wafer ERO evaluation method is also disclosed. Japanese Unexamined Laid-Open Patent Application No. 2000-031224 discloses a method for evaluating quantitatively the influence of a rear surface shape on a front surface shape caused by the vacuum suction with a frequency analysis of shape changes of the front and rear surfaces measured before and after the vacuum suction.

SUMMARY OF THE INVENTION

However, with the conventional evaluation method, simply the shape of the wafer is measured and evaluated. Or, just the influence of the rear surface shape on the front surface shape caused by the vacuum suction is evaluated. That is, none of these methods evaluate the shape change of the wafer itself when the wafer is held by suction or the like with respect to each process result in each wafer processing step. Under such circumstances, a method for evaluating a shape change of a wafer by quantifying the shape change of the wafer in a constrained state or a unconstrained state is provided. A wafer processing method utilizing the evaluation method is also provided.

In the present invention, an evaluation method for evaluating a shape change of a semiconductor wafer is provided by acquiring unconstrained shape data of the semiconductor wafer in an unconstrained state, acquiring constrained shape data of the semiconductor wafer in a constrained state, and comparing these data.

Further features of the present invention, its nature, and various advantages will be more apparent from the accompanying drawings and the following description of the preferred embodiment.

BRIEF DESCRIPTION OF THE DRAWINGS

FIG. 17 is a bottom view of a wafer to indicate areas supported by a heat processing boat.

DESCRIPTION OF THE PREFERRED EMBODIMENT

Although embodiments of the present invention shall now be described in detail with reference to the drawings, the following description is provided to describe the embodiments of the present invention, and the present invention is not limited to these embodiments. Elements of the same or similar kinds will be referred to by the same or related symbols and duplicated descriptions thereof will be omitted.

Figure 1:
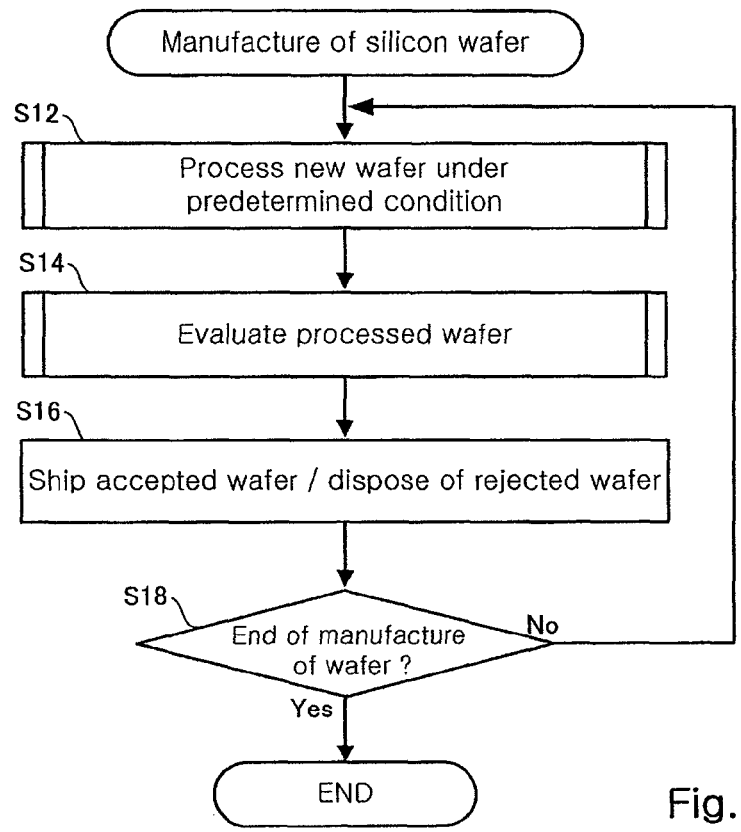
FIG. 1 shows a flow chart of a method for manufacturing a wafer.

FIG. 1 shows a flowchart of a method for manufacturing a semiconductor wafer (e.g., silicon wafer) in accordance with an embodiment of the present invention. First, a wafer having been sliced in advance is processed under a predetermined condition (step 12; hereinafter referred to as "S12"). For example, the processing may include shaping or finishing a wafer by grinding, polishing, etc.; growing an epitaxial layer; annealing a wafer; and the like. Next, the processed wafer is evaluated (S14). This evaluation will be described later. Based on the evaluation, a passed wafer (or accepted wafer) is removed for shipment or utilization in a subsequent step, or is stored as an inventory (S16). Meanwhile, a failed wafer (or rejected wafer) is disposed of as a disposal flag, to be described later, is turned ON. Then, the disposal flag is returned to be OFF (S16). If a signal to terminate a series of wafer manufacturing processes are provided (S18, Yes), the series of wafer manufacturing processes end, and if no signal to terminate the series of wafer manufacturing processes are provided (S18, No), it returns to the wafer processing step (S12).

Figure 2:
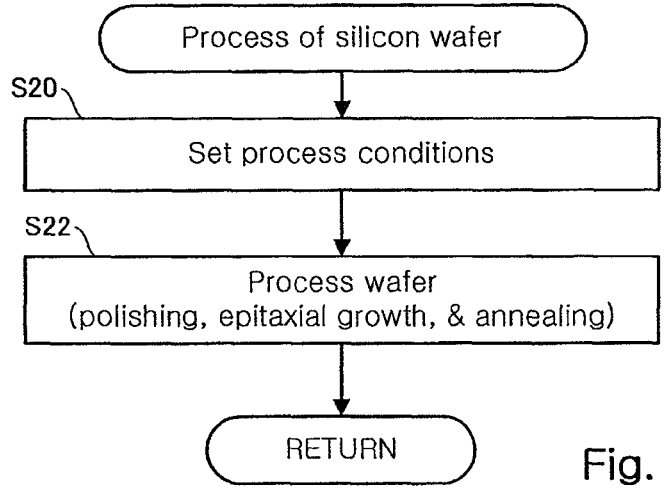
FIG. 2 shows a flow chart of a method for processing a wafer.

FIG. 2 shows a flowchart of a method for processing the wafer in detail. First, a process condition is set (S20). The condition is set in accordance with an initial condition as long as there is no feedback, which will be described later. Under this condition, the processing of the wafer such as polishing, growing an epitaxial layer thereon, and annealing is performed (S22). When the processing ends, it returns to the main flow of FIG. 1.

Figure 3:
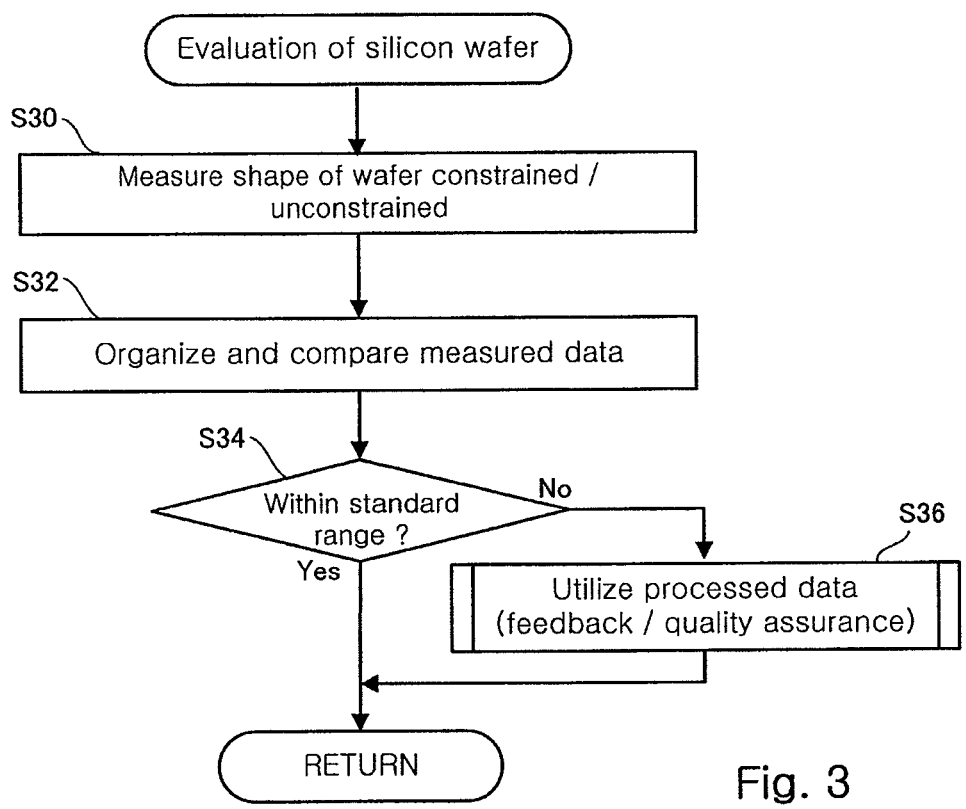
FIG. 3 shows a flow chart of a method for evaluating a shape of a wafer.

(Embodiment 1)
[Evaluation Process of Shape of Wafer]
FIG. 3 shows a flowchart of a method for evaluating shape of the wafer in accordance with Embodiment 1 of the present invention. In this shape measurement routine, the shape of the wafer is measured in a so-called free state (or unconstrained state) when the wafer is just placed on a contact surface of a predetermined platform, and the shape of the wafer is measured when the wafer is constrained onto a contact surface (as a reference surface) of a holder by suction, which may be referred to as a vacuum chuck (S30). The contact surface of the holder may be utilized as the contact surface of the platform if the suction is not applied. Then, the measured shape data are organized and compared such that the difference therebetween is obtained (S32). And it is determined whether the difference is within a predetermined standard range or not (S34), and if the difference is within the range (S34, Yes), it returns to the main flow. On the other hand, if the difference falls outside the range (S34, No), feedback to the processes and a quality check (S36) are performed and then it returns to the main flow. By the feedback, the condition having set previously may be changed from a plurality of viewpoints into one condition after another condition in a predetermined priority order such that the process condition is reset in order to produce a wafer of more preferable quality.

Here, shape measurement of a front surface of the wafer (S30) is described more in detail. The wafer is placed on a suction plate (i.e., vacuum chuck) of a shape measuring device as a rear surface of the wafer is in contact with a surface of the suction plate such that the rear surface is stuck onto the surface of the suction plate when a suction switch is turned on. The rear surface of the wafer is thereby pressed against and conformed to the surface of the suction plate with at most the atmospheric pressure. The surface of the suction plate is flat and has hardly any waviness so as to serves as the reference surface. Since the wafer is thus fixed to the suction plate, accurate shape data of the front surface can be obtained readily.

The suction switch is then turned off to bring the wafer in the state where the wafer is simply placed still by its own weight on the suction plate. Shape data of the front surface of the wafer are obtained in this so-called free or unconstrained state. A predetermined computation process can be performed on both data thus obtained to cancel out errors accompanying the measurement. Although measurement in the non-sucked state (i.e., unconstrained state) is performed here after measurement of the wafer in the sucked state (i.e., constrained state) is performed, the order of the two measurements may be changed. The process for canceling out the errors accompanying the measurements can be performed separately at the end of each measurement or can be performed all at once after the measurements. As will be described later, data acquisition is performed so that the shape data acquired here mainly include position data of a circumferential edge part, especially an outer edge part of the wafer.

Figure 4:
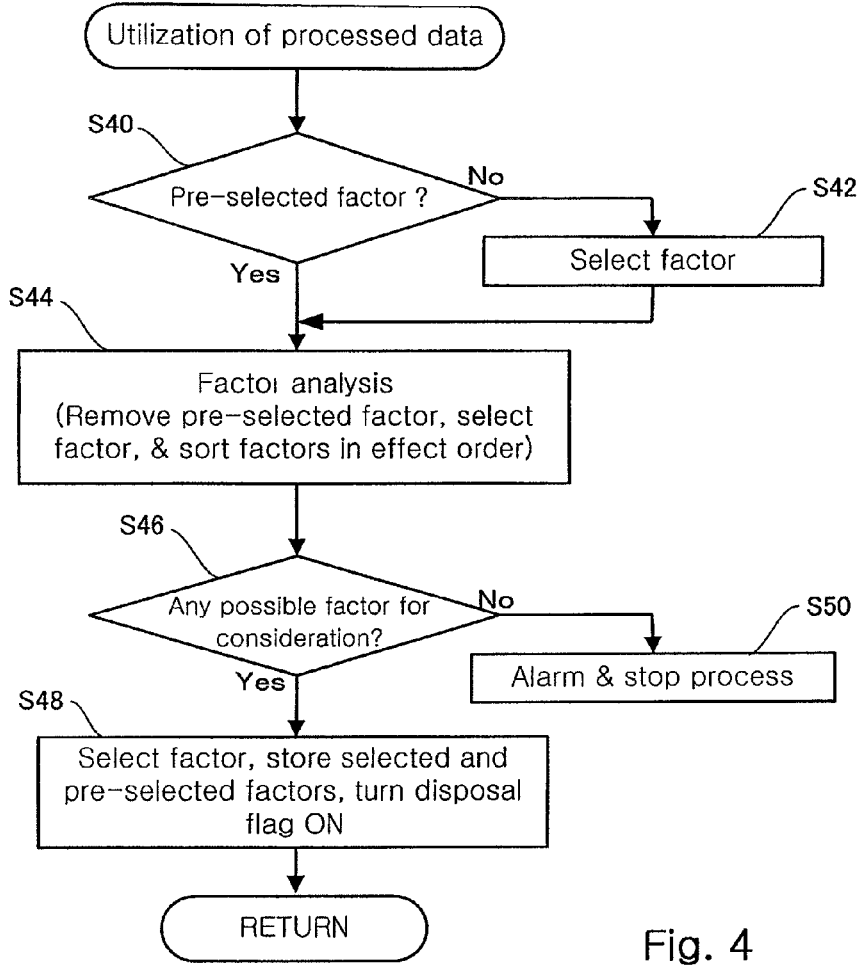
FIG. 4 shows a flow chart of a method for utilizing processed data of a wafer.

FIG. 4 shows a flow for describing a utilizing step of utilizing the processed data (S36) in detail. Here, recorded data is checked whether or not any factors have been considered and any possible solutions therefor have been tried in the previous round (if any), and if no factors have been tried (S40, No), a factor analysis is performed to pick up as many factors as possible (S42). If any factors have been considered and any solutions therefor have been tried (S40, Yes), a subsequent factor analysis is performed. In this factor analysis, the factors having already been considered for the actually-tried solutions are excluded and a next most important factor (or a factor considered the next most important) is selected. For example, if possible factors are listed in the order of effectiveness in the factor pickup step (S42) in advance, subsequent processes can be performed more quickly. If all the listed factors have been considered and the solutions therefor have been tried, the next step is entered as is. If no factors are to be selected (S46, No), it is assumed that the factor consideration has been completed such that an alarm goes off for abnormality, and a stopping process for shutting down the system is performed (S50). If any selectable factor exists (S46, Yes), a subsequent memorizing step of storing records such as the factor selection and so on is entered. In this step, the newly selected factor, the already selected factors, the flag status (set ON for instructing to dispose of a failed wafer), and so one are memorized by a memory (S48). Then, the program returns to the main flow of FIG. 1. Because a problem and the like having happened during the wafer processing can thus be solved in the predetermined order in accordance with the flow, the wafer manufacture can be continued efficiently.

Figure 5A:
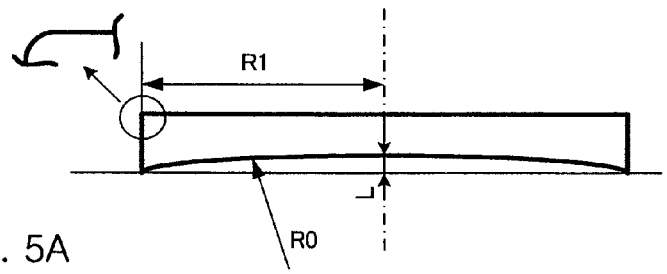
FIG. 5A is a schematic view of a shape of a wafer without suction.
Figure 5B:
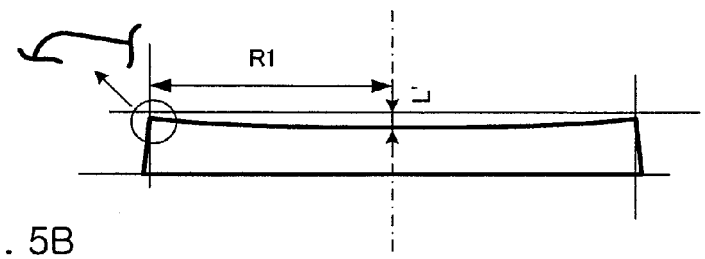
FIG. 5B is a schematic view of a shape of a wafer with suction.

With the above-described wafer evaluation method, it is possible to evaluate easily the quality degradation by predictable external deformation (for example, built-up contamination) due to precipitation of contamination such as deposit and the like or predictable wafer deformation during the processing. FIGS. 5A and 5B show schematically such external deformation or wafer deformation. FIG. 5A shows a shape of a wafer having radius R1 in a non-sucked state in a cross-sectional view. The rear surface is in a centrally-depressed concave shape due to grinding, polishing, etc., and is curved at a radius of curvature of R0. Here, a central depression depth L is $R0(1-\cos\theta)$, with $\theta=\sin^{-1}(R1/R0)$. Meanwhile, when the wafer is sucked onto the reference surface as shown in FIG. 5B, it is considered that a bottom circumference juts out since the bottom surface is slightly larger than the top surface and the curvature of the concave shape is reflected on the front surface such that the front surface is concave in the central part with a depth of L' slightly smaller than L. Since the curvature of the rear surface (bottom surface) is readily reflected on the front surface (top surface) by suction (i.e., the surface shape is easily reflected), the shape evaluation can be performed rather readily. It is also considered that a change appears prominently at an edge part. That is, a slope correction at the edge part of the wafer is not necessary in the non-sucked state because the front surface is horizontal and parallel to the reference surface although the corner of the edge is rounded in a predetermined rounding process. On the other hand, the slope correction is preferably performed in the shape evaluation if the wafer is in the sucked state, because the front surface becomes curved so as to be inclined near the edge part. When the slope correction is performed, it is considered that a distance in the radial direction of the front surface is elongated slightly. Thus, when a magnified corner view of FIG. 5B with the slope correction is superimposed on that of FIG. 5A, it can be seen that the corner in FIG. 5B is slightly shifted outside.

Although an example of polishing is described here, a situation similar to that of FIGS. 5A and 5B can be considered in the case where deposit or the like is built-up near the edge part of the rear surface. That is, when a bump or deposit (but not curvature) is formed at the edge part such that the shape is reflected on the front surface by suction, a shape similar to that of FIG. 5B appears on the front surface. Because the wafer has a certain thickness, a sharp convex/concave shape on the rear surface is dulled by the reflection. It is thus considered that with the present evaluation method, a deformation or built-up bump (deposit, etc.) near the edge part on the rear surface can be evaluated by the shape near the edge part on the front surface.

Figure 6:
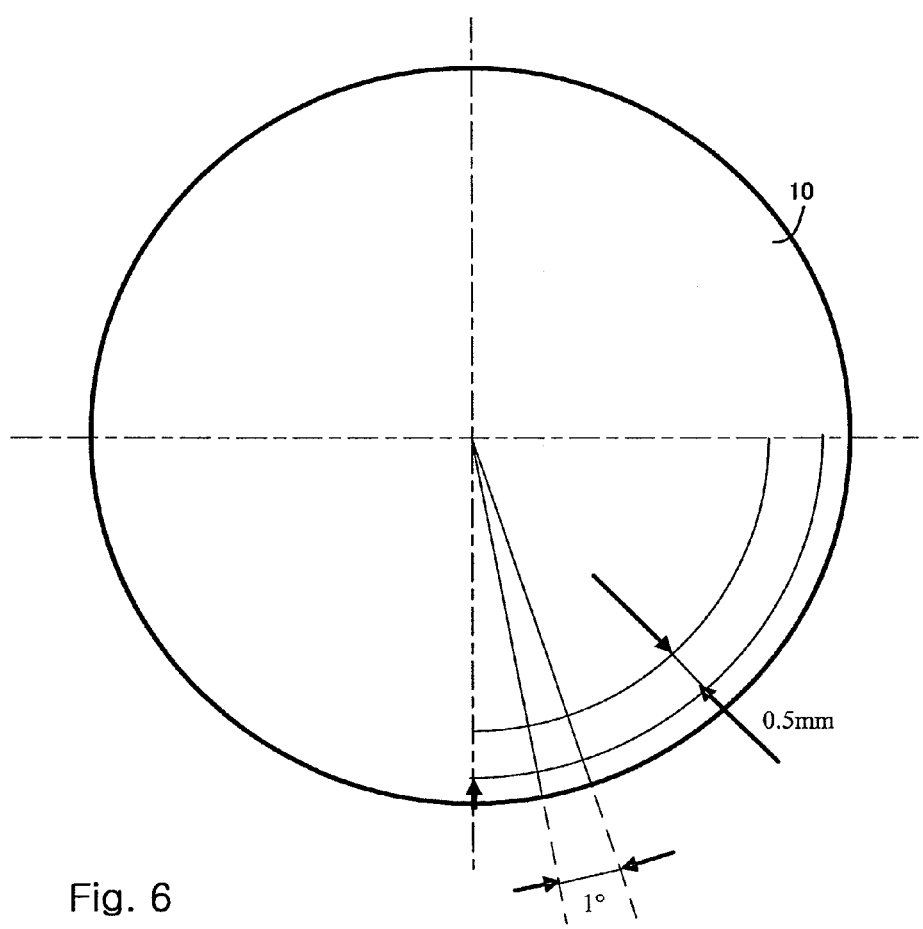
FIG. 6 is a plan view of a front surface of a wafer to indicate measurement positions.

FIG. 6 illustrates a portion and range thereof from which shape data is to be acquired in particular. With the present embodiment, the shape of the front surface of a wafer 10 is measured optically by using Dynasearch XP, made by Raytex Corp., as a shape measuring device. Here, visible light emitted by a white LED as a light source is used. The shape of the circumferential edge part of the wafer is measured along an entire circumference of the wafer 10 at every angular interval of one degree. The surface shape is measured from the outer edge to the half of the radius of the wafer at 0.5 mm pitch along a radial line drawn at every one degree in the angular direction. For example, in a case where the wafer has a size of 200 mm in diameter, the surface shape is measured in a range of 50 mm to 100 mm from the center along the radial line and the measured data in a circumferential direction are averaged arithmetically. The measurement range may be changed in any way according to various conditions such as size of the wafer and so on.

Now, the shape data correction will be described. From the actually measured data, a wafer slope (first order component) is eliminated by a least squares method or the like, and measurement noise of a wavelength component corresponding to the waviness (second order component) is cancelled out or minimized. Although such correction of the actually measured data can be performed at any location in the radial direction, the correction is performed for the data measured in a range that excludes near the outer edge of the wafer. This is because a sudden change in the shape data tends to occur at the outer edge such that the correction components of slope and waviness may not be distinguished with ease. For example, it is preferable that the correction is performed in a range of approximately 70% to 99% of the radius R from the center of the wafer and more preferably from the outer edge toward the center of the wafer. This range is, for example, from 80 to 90 mm in the radius of a wafer of 200 mm diameter, and from 120 to 140 mm in the radius of a wafer of 300 mm diameter.

Figure 7:
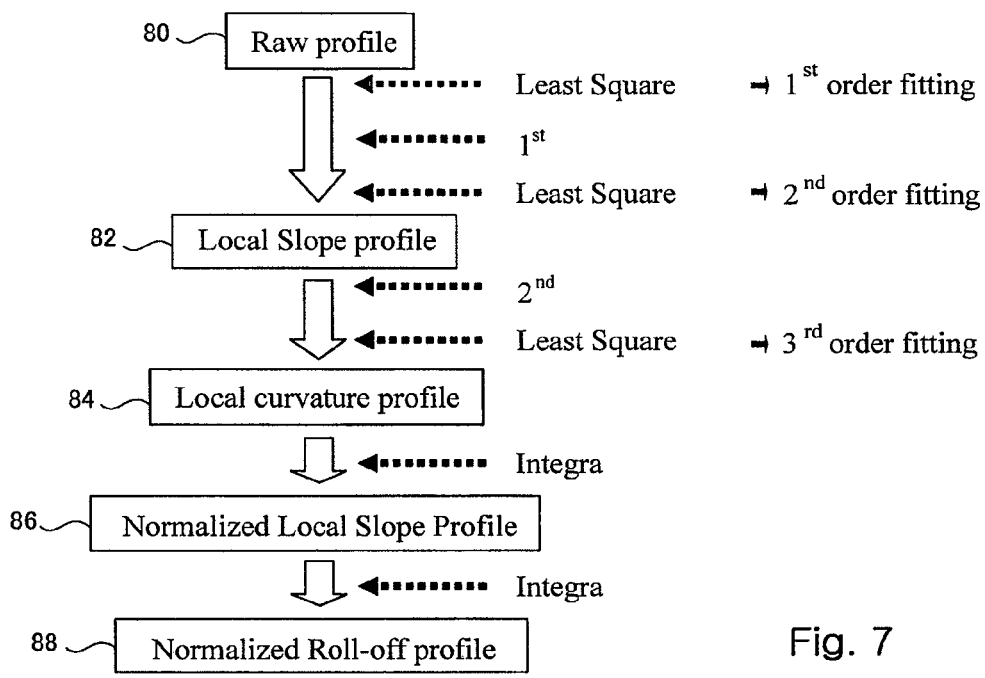
FIG. 7 shows a flow chart to illustrate steps of a data correction process of shape date of a wafer.

FIG. 7 is a flow diagram of the correction processing of shape data of the wafer. First, the wafer is set stationary on a measurement base (or a suction plate without any suction). Then, as shown in FIG. 6, by rotating a measurement line (a hypothetical line along a measurement direction) with one-degree intervals in the radial direction, shape data are acquired along the measurement line throughout the entire circumference. The data of corresponding measurement points along each measurement line are then arithmetically averaged throughout the entire circumference to obtain a raw profile 80. The scattered data of the raw profile 80 are fitted to a linear approximation equation by the least squares method. Next, the linear approximation component is subtracted from the actual measurement data to obtain first order correction data. Then, using another approximation equation (in a case of a linear equation, an applicable range is changed; in a case of a second order equation or other approximation equation containing a curve, the applicable range is selected appropriately; or the same range may be applied), fitting to this approximation equation by the least squares method is performed. A local slope profile 82 is thus obtained. Furthermore, the application range is changed and fitting to a curved approximation equation (for example, a polynomial of second, third, fourth, or higher order) is performed by the least squares method to obtain a local curvature profile 84. By the least squares method, the slope and the intercept for the approximation line can be determined by the following equations.

$$S(X) = \Sigma X^2 - (\Sigma X)^2/n$$

$$S(XY) = \Sigma XY - (\Sigma X) \cdot (\Sigma Y)/n$$

$$Slp = S(X)/S(XY)$$

$$Y = Slp(X - X_1) - Y_1 \quad (1)$$

The approximation curve obtained in the local curvature profile 84 is integrated such that the slope is normalized to obtain a normalized local slope profile 86. By the slope thus obtained, the slope component is eliminated from normalized actual measurement data to determine a normalized roll-off profile 88. The respective profiles are then obtained in the same manner for the state where the wafer is sucked.

The normalized shape data are thus obtained for the wafer in the sucked state and the wafer in the non-sucked state. A difference Vd between the normalized roll-off profile Vxoff of the wafer in the non-sucked state and the normalized roll-on profile Vxon of the wafer in the sucked state is then determined.

$$Vd = Vxon - Vxoff \quad (2)$$

The Vd thus obtained is squared and integrated over the measurement range (for example, the range of 70% to 99% of the radius from the center). It can thus be understood that when the integration value is minimized, deformation is minimized. It can thus be understood that the shape data of the wafer with and without suction can be evaluated using the Vd. Next, if values of Vd satisfy a predetermined specification, the shape change of the wafer is small such that the wafer can be accepted. On the other hand, if the specification is not met, the wafer is to be rejected, and various actions can be taken according to the degree of deviation from the specification.

Figure 8A:
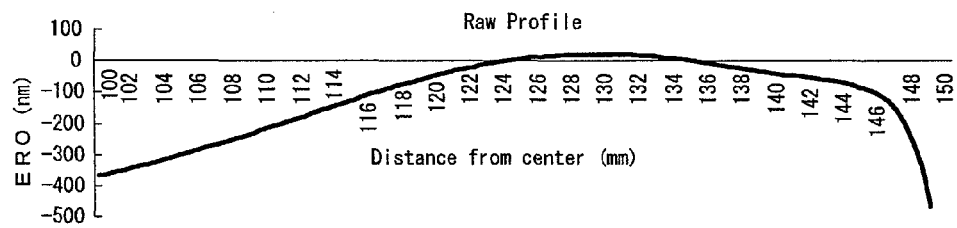
FIG. 8A shows a raw profile of a wafer.
Figure 8B:
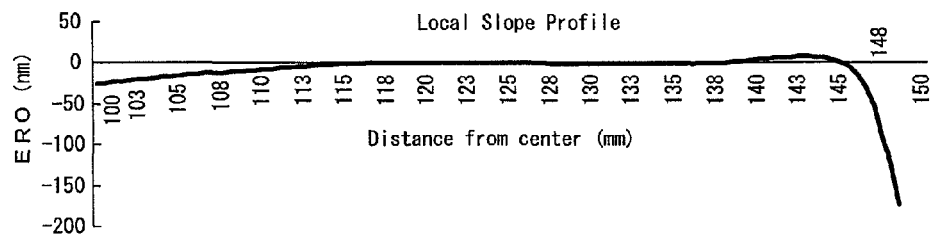
FIG. 8B shows a local slope profile of a wafer.
Figure 8C:
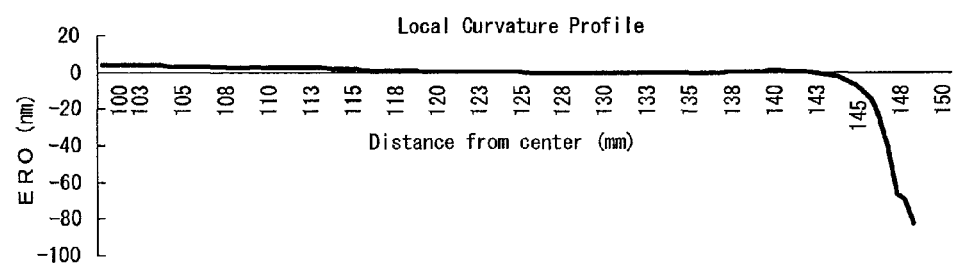
FIG. 8C shows a local curvature profile of a wafer.
Figure 8D:
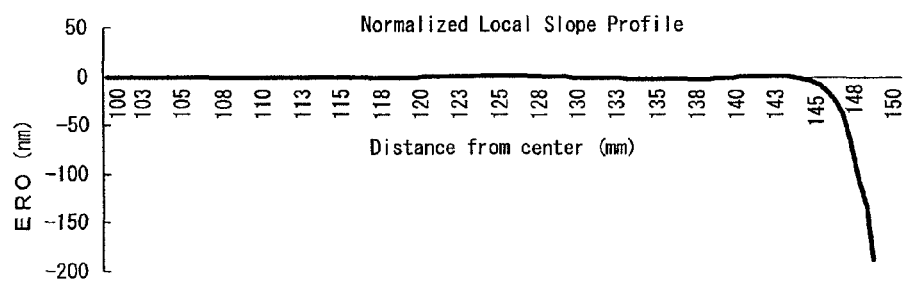
FIG. 8D shows a normalized local slope profile of a wafer.
Figure 8E:
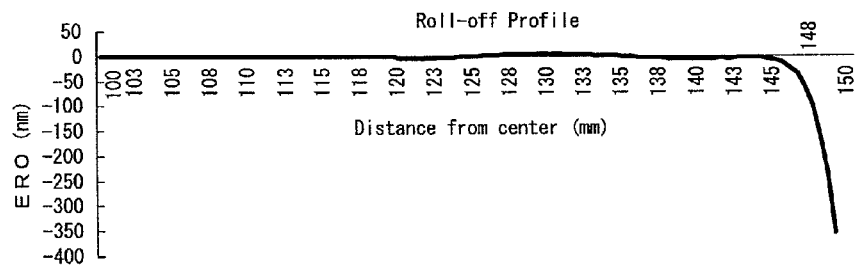
FIG. 8E shows a roll-off profile of a wafer.

FIGS. 8A to 8E show graphs of profiles resulting from the correction of the shape data in accordance with the flow of FIG. 7. In FIGS. 8A-8E, an abscissa axis (horizontal axis)

expresses a horizontal position from the center of the wafer 10 and an ordinate axis expresses an ERO (edge roll-off). FIG. 8A is a graph showing plotted data in a range of 100 mm to 150 mm in the radial direction from the center of the wafer. The plotted data are obtained by arithmetically averaging, throughout the circumference at the one-degree intervals, height values at each corresponding position along each radial line of the 300-mm-diameter wafer placed in the non-sucked state on the suction plate. FIGS. 8B and 8C are graphs in which corrected shape data in the range of 80 mm to 90 mm along the radial line from the center of the wafer are plotted. The local slope profile data are plotted in FIG. 8B and the local curvature profile data are plotted in FIG. 8C. The normalized local slope profile and the normalized roll-off profile data are plotted in FIGS. 8D and 8E.

Figure 9A:
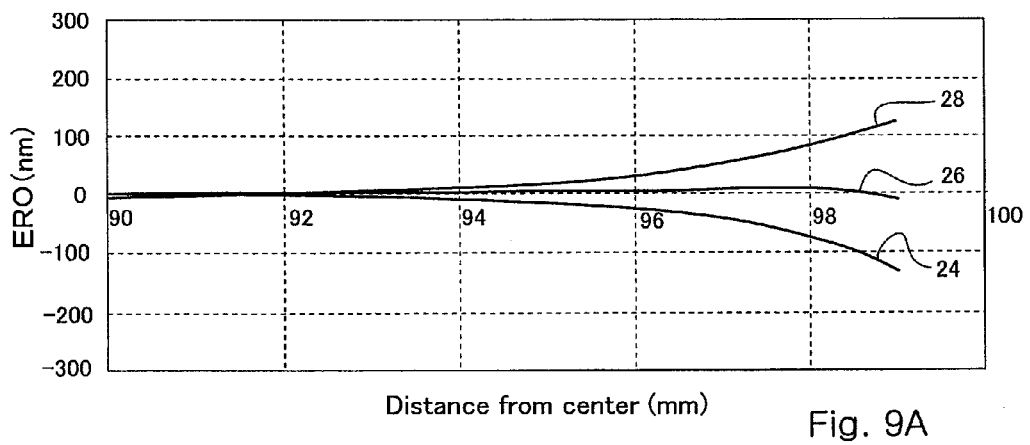
FIG. 9A shows a graph to illustrate shape changes of a wafer with and without suction.
Figure 9B:
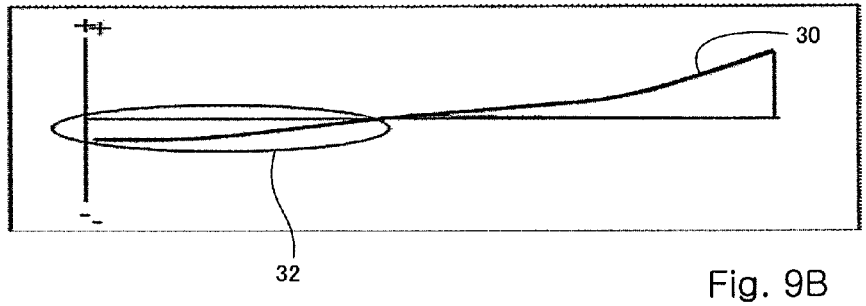
FIG. 9B shows a graph to illustrate schematically a curve corresponding to one of the curves shown in FIG. 9A.

FIGS. 9A and 9B show a graph of the EROs of the 200-mm-diameter wafer in the non-sucked state and the sucked state for determining total amounts of shape change of the wafer between in the non-sucked state and in the sucked state; and a graph of the difference of the EROs. In FIG. 9A, the abscissa axis expresses the horizontal position from the center of the wafer 10 and the ordinate axis expresses the ERO (edge roll-off). Shape data 24 in the non-sucked state are indicated by a curve at the lowest position in the figure, shape data 26 in the sucked state are indicated by a middle curve; and difference data 28 of the two sets of shape data are indicated by a top curve at the highest position. In order to understand the shape change amount by the total amount, the shape change amount can be expressed as an area of a portion surrounded by the curve 28 and the X-axis. FIG. 9B is a graph schematically expressing a curve 30 corresponding to the difference 28 in the graph of FIG. 9A. However, with this graph, the difference data between the shape data 26 in the sucked state and the shape data 24 in the non-sucked state is negative in a portion present at the left side and surrounded by an ellipse 32. Thus, to evaluate the difference curve, shape data, with which all values are made positive and a total sum is determined, are preferable. Such a value is expressed by the following equation.

$$S=\sqrt{(\Sigma-Dx)^2} \quad (3)$$

The total sum of the shape data of the wafer in the sucked state and the non-sucked state thus obtained can be used in a wafer edge inspection method if necessary.

Figure 10:
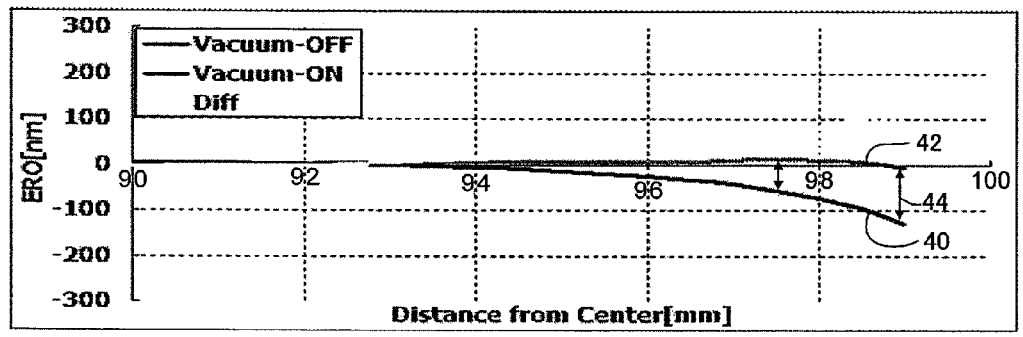
FIG. 10 shows a graph to illustrate shapes of a wafer with and without suction.

FIG. 10 is a graph of the EROs of the wafer in the non-sucked state and the sucked state. The abscissa axis of FIG. 10 expresses the horizontal position from the center of the wafer 10 and the ordinate axis expresses the ERO (edge roll-off). If the ERO shows positive values, they indicate how much the wafer is lifted with respect to the reference surface. On the other hand, if the ERO shows negative values, they indicate how much the wafer is depressed with respect to the reference surface. FIG. 10 is a graph showing plotted shape data 40 of the wafer in the non-sucked state and plotted shape data 42 of the wafer in the sucked state. A portion of the difference of the shape data of the wafer in the sucked and non-sucked states is indicated by an arrow 44 in FIG. 10.

Figure 11:
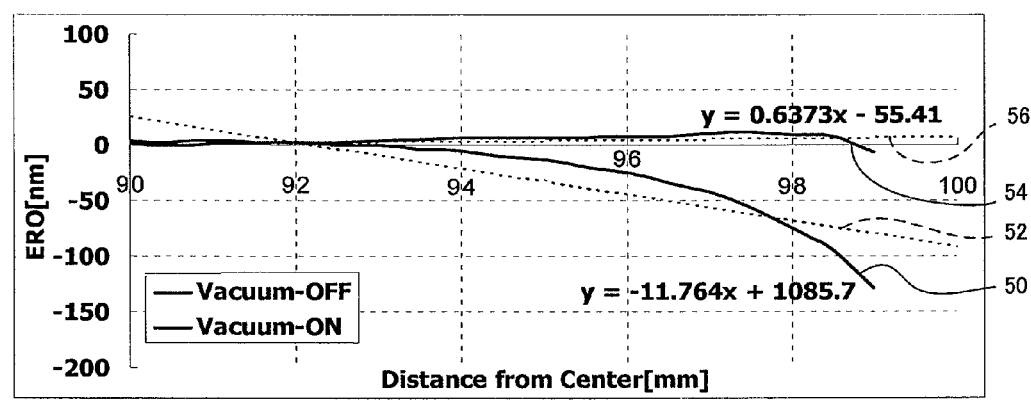
FIG. 11 shows a graph to illustrate regression lines obtained by a least-square method.

FIG. 11 is a graph showing regression lines determined by the least squares method. The abscissa axis of FIG. 11 respresents the horizontal position from the center of the wafer 10 and the ordinate axis expresses the ERO (edge roll-off). Shape data 50 for the non-sucked state and shape data 54 for the sucked state are indicated, and corresponding approximation lines 52 and 56 determined by the least squares method are indicated by broken lines.

Figure 12A:
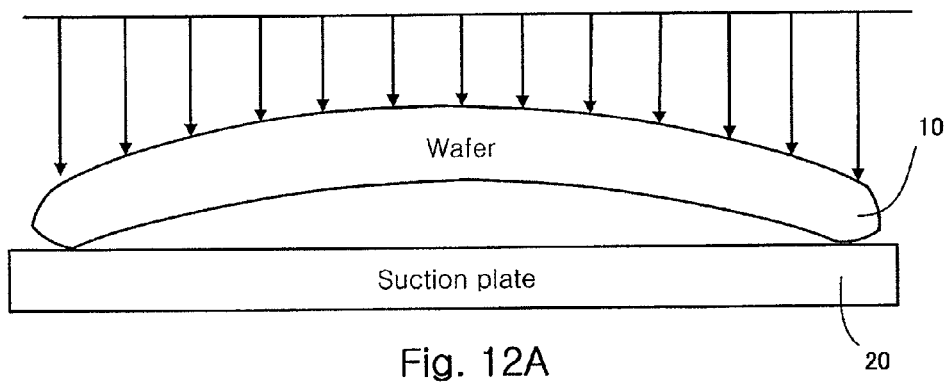
FIG. 12A shows a schematic cross section view of a wafer in a non-sucked state.
Figure 12B:
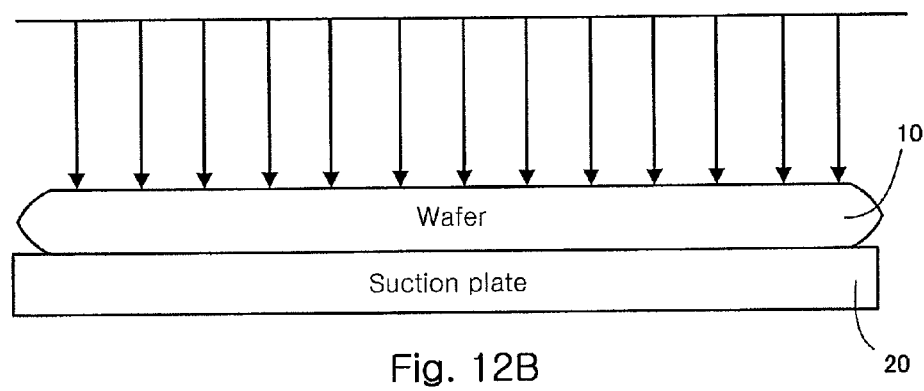
FIG. 12B shows a schematic cross section view of a wafer in a sucked state.
Figure 12C:
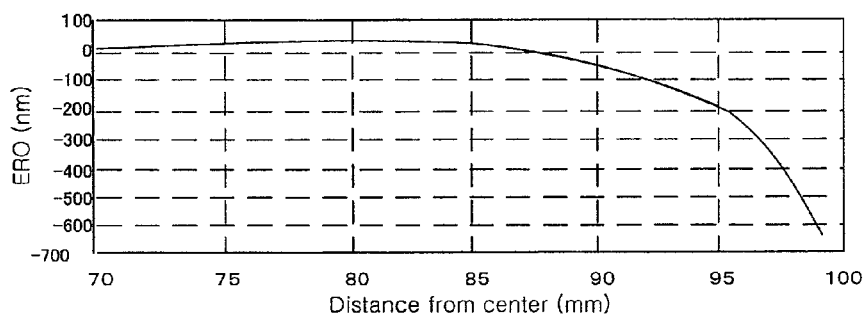
FIG. 12C shows a measured profile of a wafer in a non-sucked state.
Figure 12D:
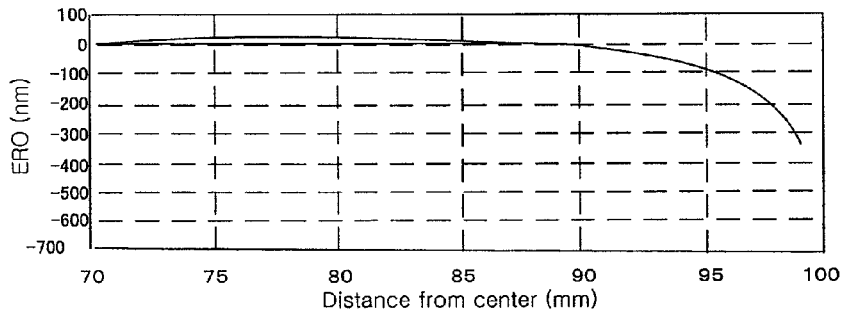
FIG. 12D shows a measured profile of a wafer in a sucked state.
Figure 12E:
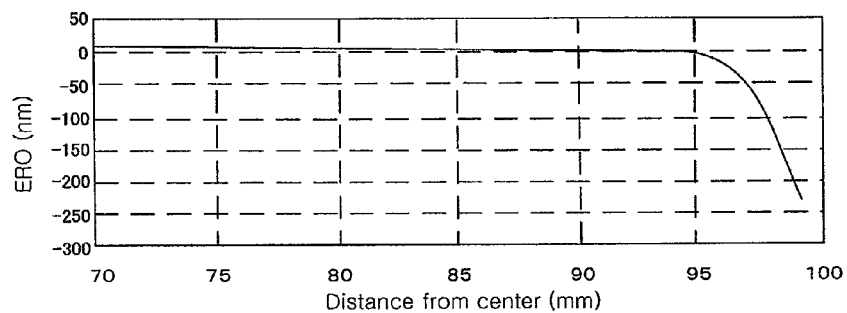
FIG. 12E shows a fitted profile of a wafer in a non-sucked state.
Figure 12F:
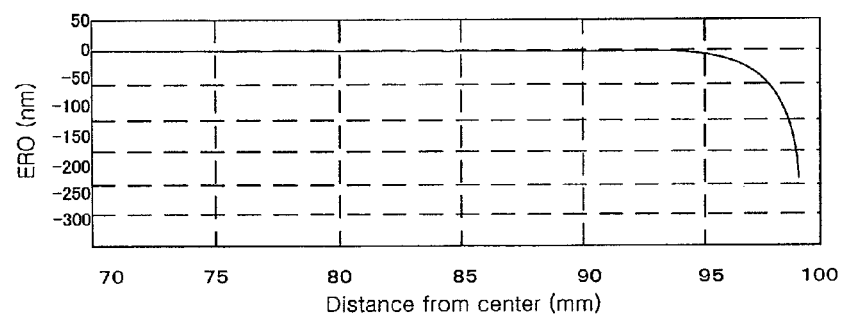
FIG. 12F shows a fitted profile of a wafer in a sucked state.
Figure 12G:
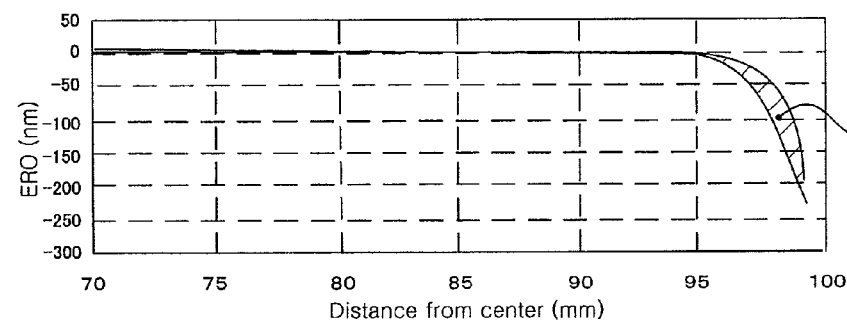
FIG. 12G shows difference of profiles of a wafer in non-sucked and sucked states.

FIGS. 12A to 12G show schematic sectional views of the wafer 10 and a suction plate 20 in accordance with this embodiment of the present invention. FIGS. 12A and 12B schematically show how the shape data of the circumferential edge to be measured would be changed between when the wafer 10 is in the non-sucked and sucked states. Actual measured values of the respective shape data of the circumferential edge are plotted in graphs of FIGS. 12C and 12D when the wafer 10 is in non-sucked and sucked states, respectively. FIGS. 12E and 12F show graphs in which shape data of the circumferential edge part, which are corrected by applying the fitting correction to the measured shape data as shown respectively in FIGS. 12C and 12D, are plotted, respectively. FIG. 12G is a graph of the shape change amount computed as differences based on FIGS. 12E and 12F.

As shown in FIGS. 12A and 12B, the shape of the circumferential edge part of the wafer 10 with 200 mm diameter is measured in the non-sucked state and in the sucked state such that the rear surface of the wafer 10 is sucked onto the suction plate 20 of the vacuum suction type of the shape measurement device after mounting the wafer 10 thereon. When the wafer 10 is sucked, by way of example, it is sucked and pressed onto the suction plate with a pressure of 400 mmHg=53.3 kPa. FIGS. 12C and 12D show graphs in which respective average shape data of the wafer are plotted, where the average shape data is obtained by arithmetically averaging measured data at each position of each radial line throughout the entire circumference. According to the graphs of FIGS. 12C and 12D, it should be understood that the front surface in the non-sucked state and in the sucked state swells (goes up) in a range of 70 to 90 mm and goes down in a range of 90 to 100 mm so as to droop down drastically at the edge part and make the thickness of the wafer thinner. Next, according to FIGS. 12E and 12F, it should be understood the front surface in the non-sucked state or in the sucked state does not swell (or go up) in the range of 70 to 90 mm because the shape data correction is performed. In FIG. 12G, the respective curves of the FIGS. 12E and 12F are shown in a superimposed manner. The symbol 22 indicates the difference between the curves as shown in FIGS. 12E and 12F so as to indicate the shape change of the outer edge of the wafer between in the non-sucked state and in the sucked state. In regard to this shape change, the difference between the two curves around the outer edge part can be represented by an area 22.

Therefore, it is possible to evaluate and represent quantitatively the shape change of the wafer 10, which may influence the manufacturing process and device process, when the wafer 10 in the non-sucked state is sucked. Also, it is possible to evaluate the shape data of the wafer 10 in the non-sucked state by assuming the shape change when the wafer 10 is sucked since the shape change of the wafer 10 from in the non-sucked state to in the sucked state can be predicted by measuring the portion indicated by the numerical reference 22. Also, based on the evaluation, it is possible to eliminate, in an inspection step, the wafer in which generation of particles and/or surface defects may occur from the surface as the surface layer is broken because of the stress caused by the shape change of the wafer before and after the wafer suction onto the suction plate.

(Embodiment 2)

Figure 13:
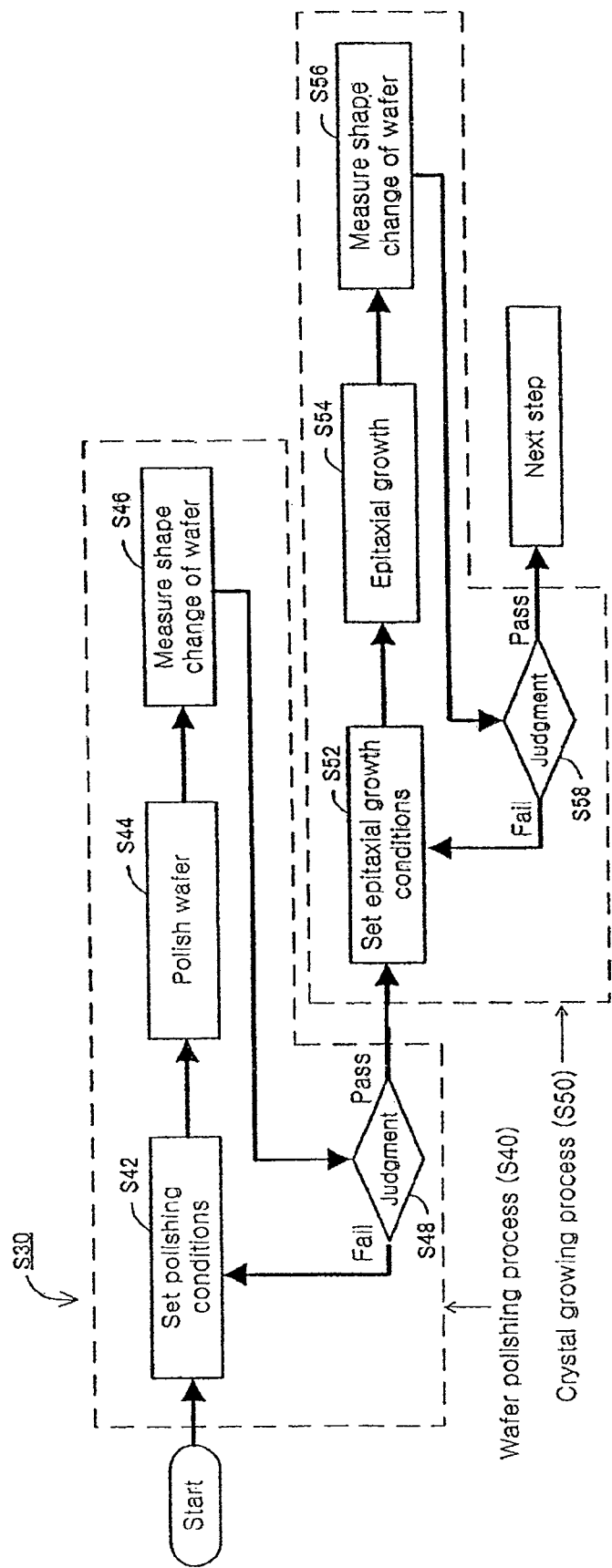
FIG. 13 shows a flow chart of a method for manufacturing a wafer utilizing a shape evaluation.

FIG. 13 shows a flowchart for a wafer manufacturing method employing the wafer shape evaluation method according to another embodiment of the present invention. The wafer manufacturing method (S30) is mainly constituted of a polishing step (S40) and an epitaxial crystal growing step (S50). The polishing step (S40) is constituted of a polishing condition setting step (S42), a wafer polishing step (S44), a shape change amount measuring step (S46), and a determining step (S48). The crystal growing step (S50) is constituted of a epitaxial process condition setting step (S52), an epitaxial layer growing step (S54), a shape change amount measuring step (S56), and a determining step (S58). The wafer manufacturing method (S30) is applicable to both a single wafer processing and a batch processing.

Figure 14:
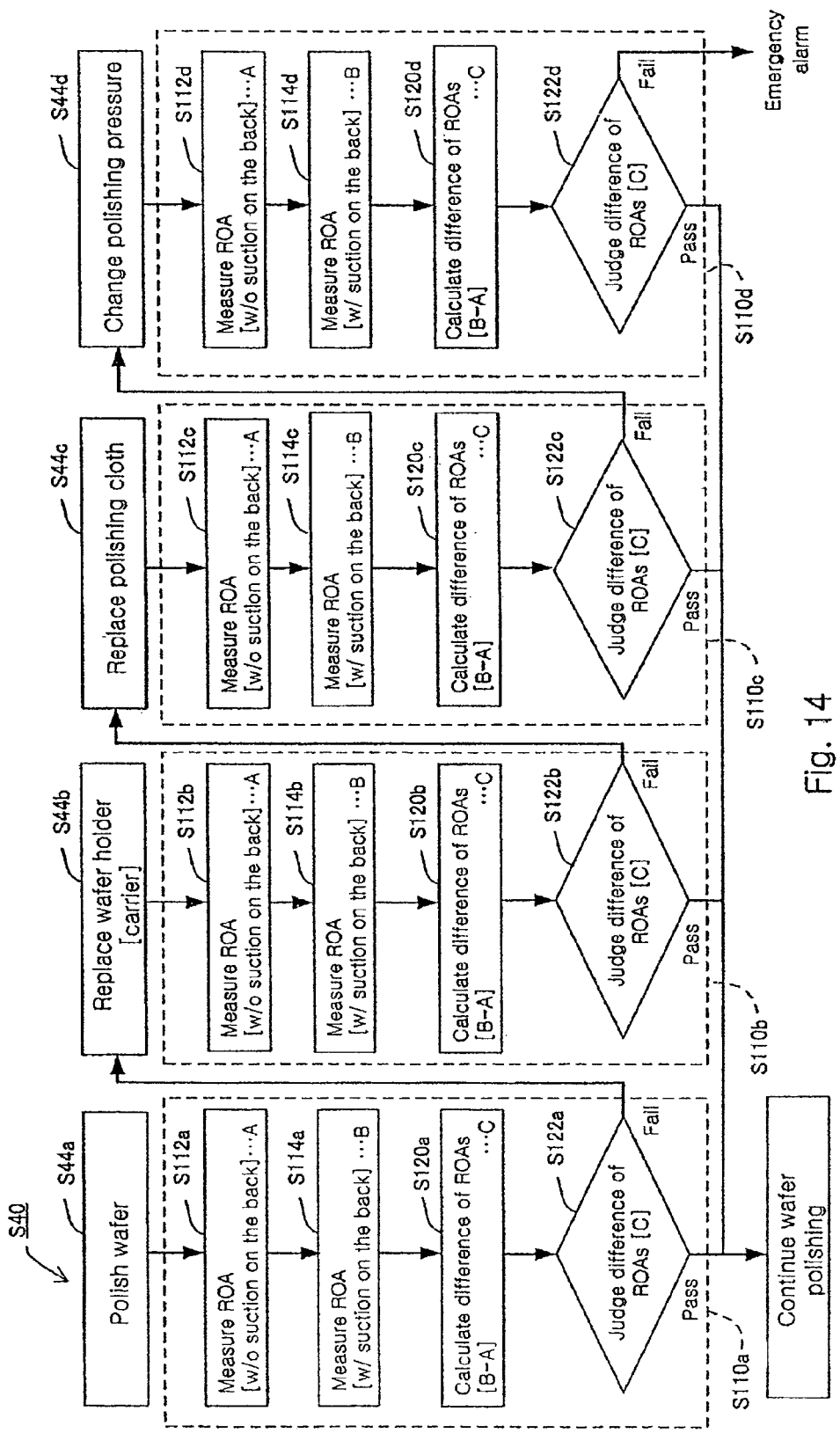
FIG. 14 shows a flow chart of a method for polishing a surface of a wafer utilizing a shape evaluation.

FIG. 14 shows the wafer polishing step (S40) in more detail. In a step corresponding to the polishing condition setting step (S42) of FIG. 13, an initial setting is performed. Specifically, a polishing device is determined and a holder for holding the wafer, which is the object to be ground, in the polishing device is determined in accordance with the determined polishing device. A polishing cloth is determined as a sliding or rubbing counterpart, and a pressure by which the wafer is pressed against the polishing cloth (processing surface pressure) is determined. In addition, various other conditions related to polishing, such as a rotation speed of a rotating head provided with a polishing cloth, a type, concentration, pH, and supply amount of a polishing agent, a temperature, a polishing duration, etc., are set.

Once the initial conditions are determined, the wafer mounted in the predetermined holder is polished (S44a). In this process, the wafer is fixed to the holder by vacuum suction (vacuum chuck), adhesion, mechanical fastening, etc. When the polishing with the initial conditions ends, shape data of the polished wafer is acquired. Specifically, the wafer removed from the holder is set stationary with the front surface facing up on a measurement stage (or measurement plate) of a shape measuring device. At this time, the rear surface is not sucked. The shape data are measured in a substantially unconstrained state (S112a). The wafer is then sucked and fixed onto the measurement stage or the predetermined polishing holder. The shape data are then acquired in this state (constrained state) in the same manner as in the case of the wafer in the unconstrained state (S114a). These data are then corrected or modified appropriately and processed to make data enabling comparison, then, the difference data is calculated (S120a). The difference data is thus-determined as described above. The difference data is then compared with a predetermined reference value to make a pass/fail determination (S122a).

If the wafer is consequently determined to be accepted (S122a, pass), the next wafer is polished according to the initial setting conditions (S44a). If the wafer is determined to be rejected (S122a, fail), it is determined that adequate results cannot be obtained with the initial setting conditions such that a subsequent condition setting is performed. More specifically, the initially set wafer holder is replaced with a new one (S44b). Here, the rejected (or failed) wafer is disposed of while the accepted (or passed) wafer goes to the subsequent step (for example, the crystal growth step of FIG. 13).

Then, the wafer holder (carrier) of the polishing device is replaced with a new one (S44b), and a new wafer mounted to this new holder is polished (S44b). In this process, the wafer is fixed by vacuum suction (vacuum chuck), etc., to the holder as mentioned above. When the polishing with the initial conditions except the wafer holder is completed, the shape data of the polished new wafer is acquired. Because the following steps (S112b, S114b, S120b, and S122b) are the same as described above, duplicated description is to be omitted. Then, if the wafer is determined to be accepted (S122b, pass), another new wafer is mounted onto the holder and the polishing step (S44b) is performed as mentioned above. If the wafer is determined to be rejected (S122b, fail), the polished wafer is disposed of and a subsequent condition setting step (S44c) is entered.

In this step (S44c), the polishing cloth, against which the front surface of the wafer is rubbed, is replaced. The polished wafer is removed and a new wafer is mounted onto the same holder. The new wafer is then polished under the same conditions as the polishing conditions used immediately before the step S44c except the replacement of the old polishing cloth (S44c). In this process, the wafer is fixed by vacuum suction, etc., to the holder as mentioned above. When the polishing according to the already-set initial conditions except the old polishing cloth and the old holder is completed, the shape data of the polished new wafer are acquired. Because these steps (S112c, S114c, S120c, and S122c) are the same as described above, duplicated description thereof will be omitted. Then, if the wafer is determined to be accepted (S122c, pass), another new wafer is mounted to the holder and the polishing step (S44c) is performed as mentioned above, and if the wafer is determined to be rejected (S122c, fail), the polished wafer is disposed of and a subsequent condition setting step (S44d) is entered.

Then, the pressure by which the wafer is pressed against the present polishing cloth (processing surface pressure of polishing device) is changed to an optimal pressure (S44d) and the new wafer mounted to the same holder is polished (S44d). In this process, the wafer is fixed by vacuum suction (vacuum chuck), etc., to the holder as mentioned above. When the polishing according to the polishing conditions used immediately before the change of the pressure except the pressure condition, the old polishing cloth, and the old holder is completed, the shape data of the polished new wafer is acquired. Because these steps (S112d, S114d, S120d, and S122d) are the same as described above, description thereof will be omitted. Then, if the wafer is determined to be accepted (S122d, pass), another new wafer is mounted to the holder and the polishing step (S44d) is performed as mentioned above, and if the wafer is determined to be rejected (S122d, fail), the polished wafer is disposed of, and because further tuning of the settings of the polishing device is difficult, the system is designed to let the alarm go off for the abnormality.

When preferable conditions on the device side can be set as described above, a predetermined number of wafers can be polished successively under the preferable conditions without interruption. When the polishing of the predetermined number of wafers is completed, the program may be returned to the polishing step (S44a) and the condition setting may be performed again.

Here, the settings are changed in the order of the replacement of the holder, the replacement of the polishing cloth, and the change of the processing surface pressure in consideration of plausible magnitudes of the effect on the difference value in the polishing device of the present embodiment. The order may be thus changed with another device, etc.

Figure 15:
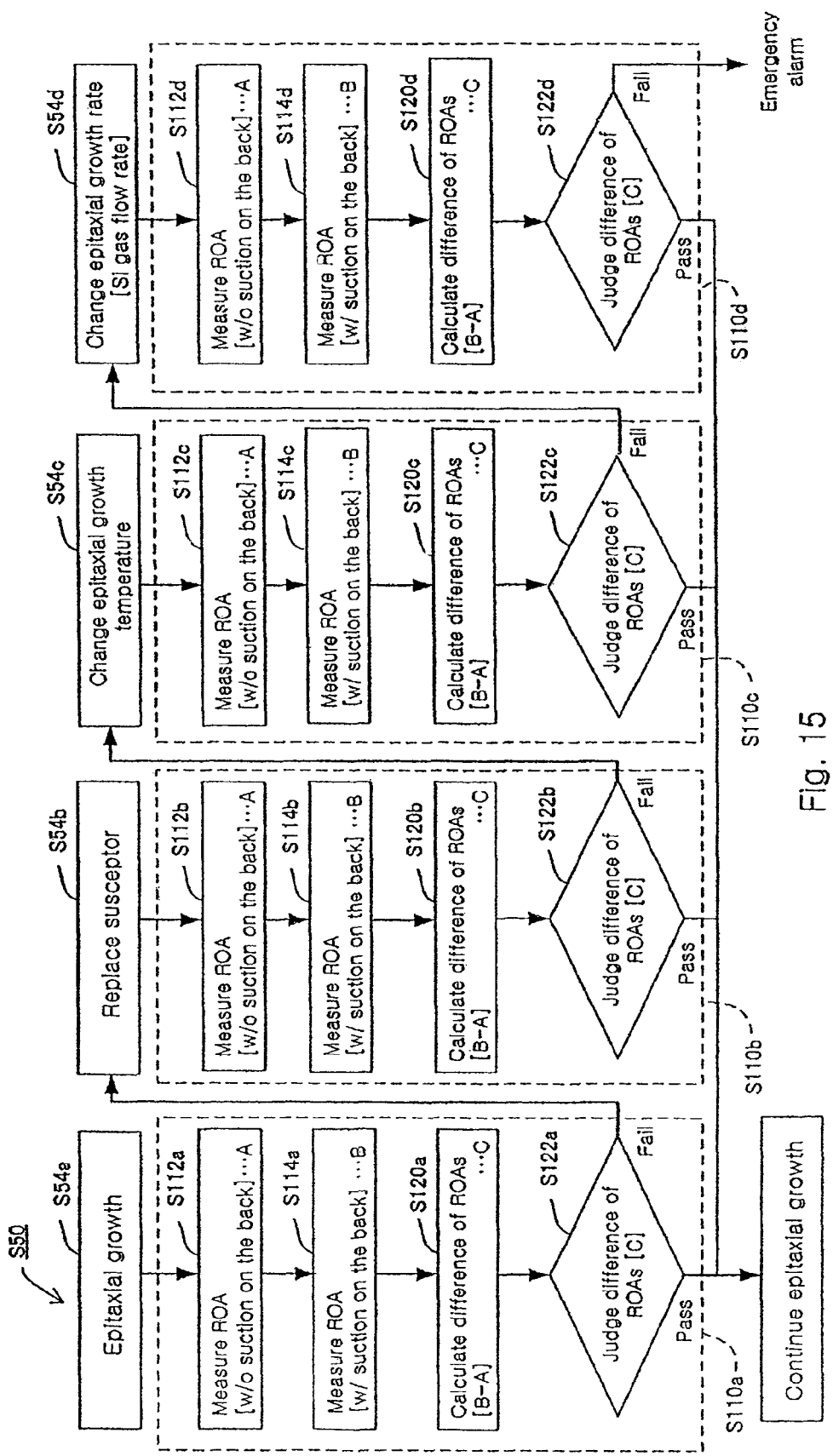
FIG. 15 shows a flow chart of a method for manufacturing an epitaxial wafer utilizing a shape evaluation.

FIG. 15 shows a flowchart illustrating the epitaxial crystal growing step (S50) in detail. The following epitaxial crystal growing step (S50) can be performed, for example, on a wafer determined to be accepted in the determining step (S48) of FIG. 13. First, in regard to an epitaxial process device, a susceptor to be used is determined, and settings related to the epitaxial process such as processing temperature (epitaxial growth temperature), processing duration, temperature raising/lowering rate, raw material (silane) gas flow rate, etc., are set. Next, the wafer is then placed on the susceptor and the epitaxial layer is grown under the above initial conditions (S54a). The epitaxial wafer is then removed and placed on the shape measuring device to acquire shape data (S112a). Because the subsequent steps (S114a, S120a, and S122a) are the same as described in the case of the polishing process, duplicated description thereof will be omitted.

If the wafer is determined to be accepted based on the difference data (S122a, pass), a new wafer is placed on the susceptor and the steps from the epitaxial growth step (S54a) to the shape data acquiring steps (S112a, S114a, S120a, and S122a) are repeated. If the wafer is determined to be rejected (S122a, fail), the epitaxial wafer is disposed of and a subsequent susceptor replacing step (S54b) is entered.

In the susceptor replacing step (S54b), a new susceptor is set inside the epitaxial device, a new wafer is placed on the susceptor, and substantially the same steps as described above (S54b, S12b, S114b, S120b, and S122b) are repeated.

If the wafer is determined to be accepted based on the difference data (S122b, pass), a new wafer is placed on the susceptor and the steps from the susceptor replacing step (S54b) to the shape data acquiring steps (S112b, S114b, S120b, and S122b) are repeated. If the wafer is determined to be rejected (S122b, fail), the epitaxial wafer is disposed of and a subsequent epitaxial growth temperature changing step (S54c) is entered.

In the epitaxial growth temperature changing step (S54c), a new epitaxial growth temperature is set, a new wafer is placed on the same susceptor and the epitaxial growing step is performed under the new epitaxial growth temperature condition (S54c). Substantially the same steps (S112c, S114c, S120c, and S122c) as described above are then repeated.

If the wafer is determined to be accepted based on the difference data (S122c, pass), a new wafer is placed on the susceptor and, using the same epitaxial growth temperature condition, the steps from the epitaxial growing step (S54c) to the shape data acquiring steps (S112c, S114c, S120c, and S122c) are repeated. If the wafer is determined to be rejected (S122c, fail), the epitaxial wafer is disposed of and a subsequent epitaxial growth rate changing step (S54d) is entered.

In the epitaxial growth rate changing step (S54d), a new epitaxial growth rate (silane gas flow rate) is set, a new wafer is placed on the same susceptor, and the epitaxial growing step is performed under the new epitaxial growth rate condition (S54d). Substantially the same steps (S12d, S114d, S120d, and S122d) as described above are then repeated.

If the wafer is determined to be accepted based on the difference data (S122d, pass), a new wafer is placed on the susceptor and, using the same epitaxial growth temperature condition and the same epitaxial growth rate condition, the steps from the same epitaxial growing step (S54d) to the shape data acquiring steps (S112d, S114d, S120d, and S122d) are repeated. If the wafer is determined to be rejected (S122d, fail), the epitaxial wafer is disposed of, and because further tuning is difficult, the system is designed to let the alarm go off for the abnormality.

When preferable conditions on the epitaxial manufacturing device side can thus be set as described above, a predetermined number of wafers can be used to manufacture epitaxial wafers under the same conditions. When the manufacture of the predetermined number of epitaxial wafers is completed, the program may be returned to the epitaxial growing step (S54a) and the condition setting may be performed again.

Here, the settings are changed in the order of the replacement of the susceptor, the change of the epitaxial growth temperature, and the change of the epitaxial growth rate in consideration of plausible magnitudes of influence on the difference value in the epitaxial manufacturing device of the present embodiment. The order may thus change with another device, etc.

(Embodiment 3)

Figure 16:
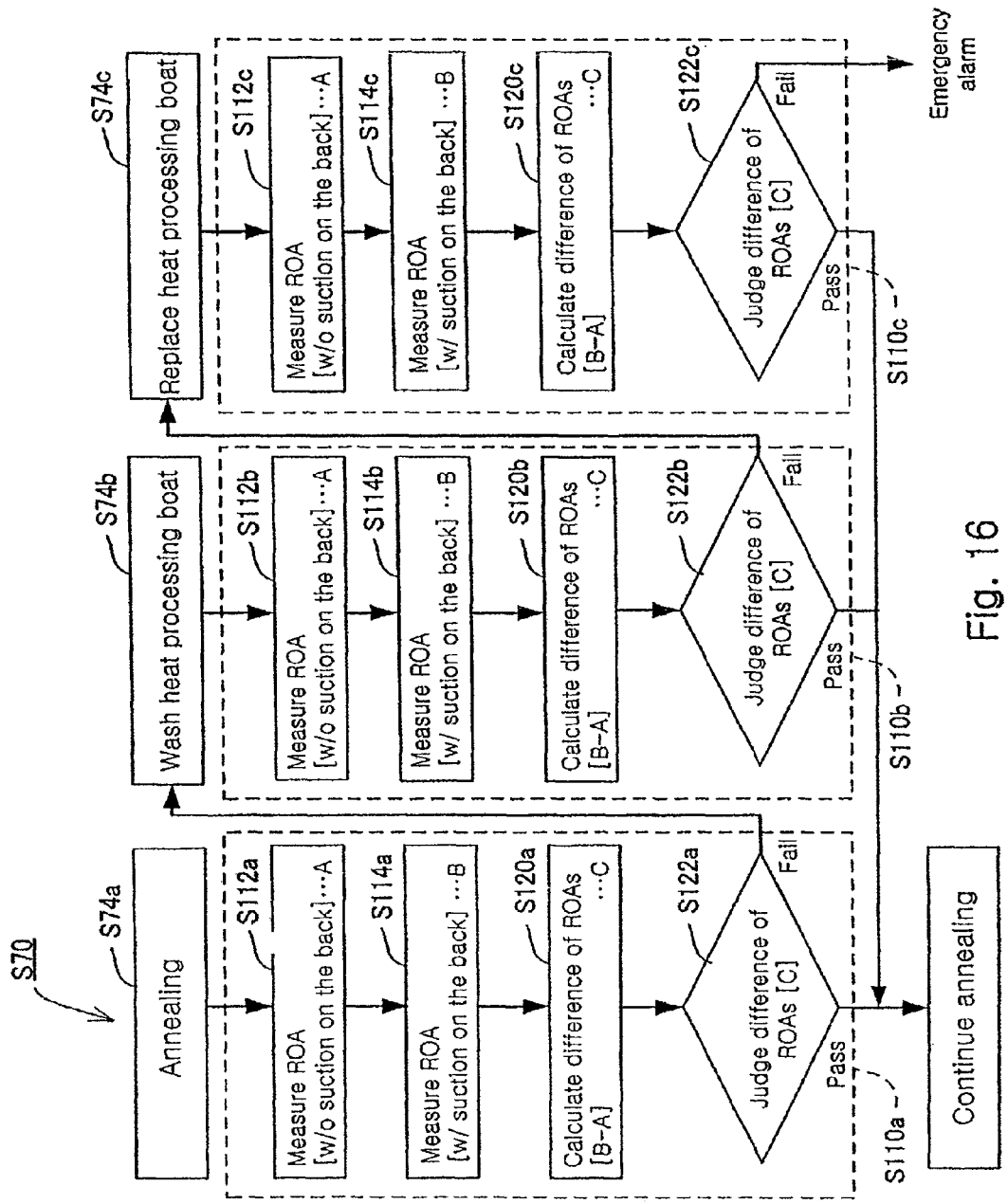
FIG. 16 shows a flow chart of a method for annealing a wafer utilizing a shape evaluation.

FIG. 16 illustrates an annealing (heat processing) step (S70) incorporating a step of evaluating wafer shape change. First, in regard to an annealing device, a heat processing boat to be used is determined and initial settings such as processing temperature, processing duration, temperature raising/lowering rate, type and flow rate of ambient gas, and other conditions related to the annealing are set. A wafer is then placed on the heat processing boat and annealing is performed under the initial conditions (S74a). FIG. 17 illustrates which portions of the wafer 10 are supported by the heat processing boat. The heat processing boat mainly supports circumferential edge portions on the rear surface of the wafer. The wafer 10 is mainly supported by rectangular supporting members 62 extending in parallel across an interval slightly narrower than the diameter of the wafer 10. The wafer is also supported supplementarily by two small rectangular supporting members 60. Of the outer circumference of the wafer 10, a portion corresponding to a total of respective central angles 64 of the supporting members 60 and 62 contact the supporting members 60 and 62 of the heat processing boat. A compressive stress due to the wafer's own weight and an accompanying shear stress arise at the contacting portions.

After annealing is performed under the initial conditions, the annealed wafer is removed and placed on the shape measuring device, and the shape data are acquired (S112a). Because the subsequent steps (S114a, S120a, and S122a) are the same as described in the case of the polishing process, duplicated description thereof will be omitted.

If the wafer is determined to be accepted based on the difference data (S122a, pass), a new wafer is placed on the heat processing boat and the steps from the annealing step (S74a) to the shape data acquiring steps (S112a, S114a, S120a, and S122a) are repeated. If the wafer is determined to be rejected (S122a, fail), the annealed wafer is disposed of and a subsequent heat processing boat washing step (S74b) is entered.

In the heat processing boat washing step (S74b), the heat processing boat is washed and silicon and other contaminants attached to the portions in contact with the wafer 10 are washed off. The surface of the contacting portions of the heat processing boat is thereby made less likely to react with the wafer. A new wafer is then placed on the washed heat processing boat, and substantially the same steps as described above (S74b, S12b, S114b, S120b, and S122b) are repeated.

If the wafer is determined to be accepted based on the difference data (S122b, pass), a new wafer is placed on the heat processing boat and the steps from the heat processing boat washing step (S74b) to the shape data acquiring steps (S112b, S114b, S120b, and S122b) are repeated. If the wafer is determined to be rejected (S122b, fail), the annealed wafer is disposed of and a subsequent heat processing boat replacing step (S74c) is entered.

In the heat processing boat replacing step (S74c), the heat processing boat is replaced with a new boat, a new wafer is placed on the new heat processing boat, and annealing is performed under the abovementioned conditions (S74c). Substantially the same steps as described above (S112c, S114c, S120c, and S122c) are then repeated.

If the wafer is determined to be accepted based on the difference data (S122c, pass), a new wafer is placed on the same heat processing boat and, under the same conditions, the steps from the heat processing boat replacing step (S74c) to the shape data acquiring steps (S112c, S114c, S120c, and S122c) are repeated. If the wafer is determined to be rejected (S122c, fail), the annealed wafer is disposed of, and because further tuning is difficult, the system is designed to let the alarm go off for the abnormality.

When preferable conditions on the annealing device side can thus be set as described above, a predetermined number of wafers can be annealed successively under the same conditions. When the annealing of the predetermined number of wafers is completed, the program may be returned to the annealing step (S74a) and the condition setting may be performed again.

Here, the settings are changed in the order of the washing of the heat processing boat and the replacement of the heat processing boat in consideration of plausible magnitudes of influence on an ease of processing and on the difference value in the annealing device of the present embodiment.

Because the ERO (edge roll-off) value of the outer edge of the wafer in the sucked state can thus be fed back to the polishing of the wafer in the polishing step (S40), the circumferential edge of the wafer 10 can be polished flatly according to the sucked state. Also, by performing the polishing step according to S40, the polishing can be performed to minimize the ERO according to the sucked state in the subsequent step. Because a localized concentrated stress that is applied to the outer edge can thus be made small when the wafer is sucked in the subsequent step, the yield in the subsequent step can be improved.

In the crystal growing step (S50), the gas used for epitaxial layer growth may flow around to the rear surface of the wafer 10 so that an unintended film is formed at the circumferential edge of the rear surface of the wafer to form a swelled shape. When such a wafer is sucked onto a suction plate in a subsequent step, the convex/concave of the rear surface of the wafer may appear on the front surface and exert an adverse effect. However, by performing the epitaxial growth according to S50, because the shape data of the outer edge of the wafer can be fed back to the epitaxial conditions, the epitaxial layer growing step can be performed to obtain an ERO shape that is preferable for suction in the subsequent step and the yield in the subsequent step can be improved.

According to the embodiments described above, the following may be included in the present invention.

An evaluation method for evaluating a shape change of a semiconductor wafer, may comprise: an unconstrained shape data acquiring step of setting the semiconductor wafer on a reference surface in an unconstrained state and acquiring shape data; a constrained shape data acquiring step of acquiring shape data of the semiconductor wafer in a state of being constrained along the reference surface; and a comparing step of comparing the unconstrained shape data and the constrained shape data.

Here, the reference surface may normally refer to a flat, planar surface and may refer inclusively to a curved surface, such as a spherical surface, a surface that is not flat (non-flat surface), and other surfaces. Such a reference surface may be understood to be a virtual surface or may be understood to be a substantive surface. For example, a single surface of a support that serves as a base may be finished to a flat, planar surface and this may be used as the reference surface. Even when the semiconductor wafer is constrained along the reference surface, it can be deemed that the reference surface or the reference surface of the base has no or substantially no distortion or other deformation. With the evaluation method, either of the unconstrained shape data acquiring step and the constrained shape data acquiring step may be performed first. That is, the above-described evaluation method includes both the case where the unconstrained shape data acquiring step is performed first and the case where the constrained shape data acquiring step is performed first. This applies likewise to a semiconductor wafer manufacturing method to be described below.

The evaluation method according to the aforementioned can be provided where the semiconductor wafer has a rear surface and a front surface, the rear surface is constrained along the reference surface, and the comparison of the unconstrained shape data and the constrained shape data is performed mainly in relation to a circumferential edge of the front surface. Here, the front surface and the rear surface are nominal designations for the sake of convenience mainly in terms of use. For example, the front surface may normally become a main object of a device process and various other processes in subsequent steps. Meanwhile, the rear surface is mainly used for holding of the semiconductor wafer. However, the two are in a relative relationship and the front surface and the rear surface are interchangeable according to circumstances.

In the evaluation method according to the aforementioned, the semiconductor wafer is constrained by the rear surface being sucked onto the reference surface.

A method for manufacturing a semiconductor wafer, may comprise: an unconstrained shape data acquiring step of setting the semiconductor wafer on a reference surface in an unconstrained state and acquiring shape data; a constrained shape data acquiring step of acquiring shape data of the semiconductor wafer in a state of being constrained along the reference surface; a comparing step of comparing the unconstrained shape data and the constrained shape data; and a processing step of using the data of the comparing step to process the semiconductor wafer.

In the semiconductor wafer manufacturing method according to the aforementioned, the processing step comprises: a polishing step of making a holder hold the semiconductor wafer and polishing the semiconductor wafer.

In the semiconductor wafer manufacturing method according to the aforementioned, the processing step comprises: an epitaxial growing process of making an epitaxial layer grow on the semiconductor wafer substrate; can be provided.

In the semiconductor wafer manufacturing method according to the aforementioned, the processing step includes: an annealing step of annealing the semiconductor wafer.

Here, the shape data may include both or either of height position data and semiconductor wafer thickness data at respective points on the front surface of the wafer. In particular, shape data on a circumferential edge, including an outer edge of the wafer, may be included. Conventionally used methods may be used to acquire the shape data. For example, a stylus type position measuring device (may include a three-dimensional measuring device), an optical measuring device using a laser, or any other device or method may be used.

The unconstrained state may include a state where the wafer is set stationary on some object, a state where the wafer is suspended, a state where the wafer is floated by pneumatic pressure, etc. The constrained state may include, for example, a state where the rear surface of the wafer is pressed and closely contacted against a predetermined reference surface, etc. For example, the rear surface of the wafer may be conformed to the reference surface. Forcibly putting the rear surface of the semiconductor wafer in contact with the reference surface may also be included. A method of making the rear surface conform is not restricted to a suction method using a vacuum table or a suction method using electrostatic force, and a contact method of conforming and holding a portion of the circumferential edge of the rear surface of the semiconductor wafer may be employed. In regard to the degree to which the rear surface of the wafer is conformed to the reference surface, preferably the same conditions are used and conforming to the same degree is performed as when making the wafer conform to mount the wafer in respective manufacturing devices used in respective device processes.

Either of the measurements of the shape data in the unconstrained state and the constrained state may be performed before the other before or after constraining the wafer to conform to the reference surface and may be performed in any order. A shape data correcting step, to be described below, may be performed with each of the measurements made before constraining the wafer to conform and after constraining the wafer to conform, or the shape data correcting step may be performed collectively after the measurements. Each shape measurement may be performed a plurality of times. For example, shape data may be measured for a circumference of the wafer at intervals of a predetermined central angle and these shape data may be reduced to a single item of shape data for the entire circumference. For data reduction, the shape data of respectively corresponding portions may simply be averaged, or reduction into a single shape data item may be performed after performing a process such as smoothing of the shape data acquired according to the central angle. The shape data (shape data in the constrained state) may be acquired with the wafer being chucked by respective devices used in respective constraining process steps.

Using the data of the comparing step may refer to directly using one or more of the unconstrained shape data items and constrained shape data items that have been corrected or processed to enable comparison, or directly using a single representative unconstrained shape data item and a single representative constrained shape data item, respectively reduced from and representing the one or more of the unconstrained shape data items and constrained shape data items that have been corrected or processed to enable comparison, or using a result of comparing the representative unconstrained shape data item and the representative constrained shape data item (for example, a single numerical value (scalar) or a combination of a plurality of numerical values (vector) obtained by the comparison). Using the data of the comparing step may also refer to individually comparing a plurality of the unconstrained shape data items and constrained shape data items that have been corrected or processed to enable comparison to obtain a plurality of comparison results and using the comparison results directly or using a result of reduction of the comparison results. For example, using the data of the comparing step may refer to comparing the representative unconstrained shape data and the representative constrained shape data and obtaining and using a deviation at an especially characteristic location. Using the data of the comparing step may also refer to linearly approximating the respective unconstrained shape data and constrained shape data by a least squares method in a range suited for fitting (for example, a range of 80 to 95% from a center with respect to a diameter), subtracting a slope component (slope) of the linear approximation from the actual shape data to correct the respective shape data, overlapping the corrected unconstrained shape data and constrained shape data within the range used for fitting to determine differences at an outer circumference, memorizing the differences as comparison data, and using the comparison data.

With the present invention, a shape change of a circumferential edge of a wafer before and after suction can be quantified and evaluated. By employing the evaluation method in a wafer manufacturing process, finer adjustment of manufacturing conditions is enabled. A wafer of less shape change at a circumferential edge, especially, an outer edge can thus be provided more efficiently. Problems due to shape change can also be minimized to achieve yield improvement in various processing steps.

What is claimed is:

1. A method for evaluating a shape change of a semiconductor wafer, comprising the steps of:
    acquiring unconstrained shape data of a circumferential edge part of the semiconductor wafer being placed on a reference surface in a unconstrained state, the unconstrained shape data being measured along a plurality of radial lines spaced around a circumference of the semiconductor wafer;
    acquiring constrained shape data of the circumferential edge part of the semiconductor wafer being constrained along the reference surface in a constrained state, the constrained shape data being measured along the plurality of radial lines spaced around the circumference of the semiconductor wafer; and
    comparing the unconstrained shape data and the constrained shape data, which represent unconstrained and constrained shapes of the semiconductor wafer along the plurality of radial lines, so as to evaluate the shape change quantitatively,
    wherein the comparing step includes integrating a difference between the unconstrained shape data and the constrained shape data along the radial line of the semiconductor wafer.

2. The method according to claim 1,
    wherein:
        the semiconductor wafer comprises a front surface and a rear surface;
        the rear surface is constrained along the reference surface;
        the unconstrained shape data and the constrained shape data are compared in the shape data of the circumferential edge part of the front surface.

3. The method according to claim 1, wherein the semiconductor wafer is constrained on the rear surface by sucking the rear surface onto the reference surface.

4. A method for manufacturing a semiconductor wafer, comprising the steps of:
    acquiring unconstrained shape data of a circumferential edge part of the semiconductor wafer being placed on a reference surface in a unconstrained state, the unconstrained shape data being measured along a plurality of radial lines spaced around a circumference of the semiconductor wafer;
    acquiring constrained shape data of the circumferential edge part of the semiconductor wafer being constrained along the reference surface in a constrained state, the constrained shape data being measured along the plurality of radial lines spaced around the circumference of the semiconductor wafer;
    comparing the unconstrained shape data and the constrained shape data, which represent unconstrained and constrained shapes of the semiconductor wafer along the plurality of radial lines, so as to evaluate a shape change quantitatively; and
    processing the semiconductor wafer utilizing a result of the comparing step,
    wherein the processing step includes eliminating the semiconductor wafer, in which generation of particles or surface defects may occur from a surface of the semiconductor wafer as a surface layer thereof is broken because of stress caused by the shape change of the semiconductor wafer before and after wafer suction along the reference surface.

5. The method according to claim 4 wherein the processing step comprises polishing the semiconductor wafer held by a holder.

6. The method according to claim 4 wherein the processing step comprises growing an epitaxial layer on the semiconductor wafer.

7. The method according to claim 4 wherein the processing step comprises annealing the semiconductor wafer.

8. The method according to claim 2, wherein the semiconductor wafer is constrained on the rear surface by sucking the rear surface onto the reference surface.

9. The method according to claim 1, wherein the semiconductor wafer comprises an outside edge and the circumferential edge part comprises a portion within several millimeters from the outside edge.

10. The method according to claim 1, wherein the semiconductor wafer comprises an outside edge and the circumferential edge part comprises the outside edge.

11. The method according to claim 4, wherein the comparing step includes integrating a difference between the unconstrained shape data and the constrained shape data along the radial line of the semiconductor wafer.

12. The method according to claim 4, wherein the semiconductor wafer comprises an outside edge and the circumferential edge part comprises a portion within several millimeters from the outside edge.

13. The method according to claim 4, wherein the semiconductor wafer comprises an outside edge and the circumferential edge part comprises the outside edge.

14. A method for evaluating a shape change of a semiconductor wafer, comprising the steps of:
    acquiring unconstrained shape data of a circumferential edge part of the semiconductor wafer being placed on a reference surface in a unconstrained state, the unconstrained shape data being measured along a plurality of radial lines spaced around a circumference of the semiconductor wafer;
    obtaining representative unconstrained data from the unconstrained shape data having been measured;
    acquiring constrained shape data of the circumferential edge part of the semiconductor wafer being constrained along the reference surface in a constrained state, the constrained shape data being measured along the plurality of radial lines spaced around the circumference of the semiconductor wafer;
    obtaining representative constrained data from the constrained shape data having been measured; and
    comparing the representative unconstrained data and the representative constrained data so as to quantitatively evaluate a shape change of the semiconductor wafer,
    wherein the comparing step includes integrating a difference between the representative unconstrained shape data and the representative constrained shape data along the radial line of the semiconductor wafer.

15. A method for manufacturing a semiconductor wafer, comprising the steps of:
    utilizing a method for evaluating a shape change of the semiconductor wafer so as to obtain an evaluation result wherein the method for evaluating the shape change comprises:
        acquiring unconstrained shape data of a circumferential edge art of the semiconductor wafer being placed on a reference surface in an unconstrained state, the unconstrained shape data being measured along a plurality of radial lines spaced around a circumference of the semiconductor wafer;
        obtaining representative unconstrained data of the unconstrained shape data having been measured;
        acquiring constrained shape data of the circumferential edge part of the semiconductor wafer being constrained along the reference surface in a constrained state, the constrained shape data being measured along the plurality of radial lines spaced around the circumference of the semiconductor wafer;
        obtaining representative constrained data from the constrained shape data having been measured;
        comparing the representative unconstrained data and the representative constrained data so as to quantitatively evaluate a shape change of the semiconductor wafer whether difference between the representative unconstrained data and the representative constrained data is within a standard range or not; and
    processing the semiconductor wafer in accordance with the evaluation result wherein the processing step includes eliminating the semiconductor wafer, in which generation of particles or surface defects may occur from a surface of the semiconductor wafer as a surface layer thereof is broken because of stress caused by the shape change of the semiconductor wafer before and after wafer suction along the reference surface.

16. The method according to claim 15 wherein the processing step comprises polishing the semiconductor wafer held by a holder.

17. The method according to claim 15 wherein the processing step comprises growing an epitaxial layer on the semiconductor wafer.

18. The method according to claim 15 wherein the processing step comprises annealing the semiconductor wafer.

* * * * *

UNITED STATES PATENT AND TRADEMARK OFFICE
CERTIFICATE OF CORRECTION

| | | |
|---|---|---|
| PATENT NO. | : 8,906,777 B2 | Page 1 of 1 |
| APPLICATION NO. | : 12/361929 | |
| DATED | : December 9, 2014 | |
| INVENTOR(S) | : Iriguchi et al. | |

It is certified that error appears in the above-identified patent and that said Letters Patent is hereby corrected as shown below:

In the Claims

Column 18

Line 10, "art" should read --part--

Line 15, "of" should read --from--

Signed and Sealed this
Thirty-first Day of March, 2015

Michelle K. Lee
*Director of the United States Patent and Trademark Office*